United States Patent
Cao

(10) Patent No.: US 10,481,438 B2
(45) Date of Patent: Nov. 19, 2019

(54) DISPLAY BASEPLATE AND PREPARATION METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Wei Cao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/744,995

(22) PCT Filed: Sep. 13, 2017

(86) PCT No.: PCT/CN2017/101536
§ 371 (c)(1),
(2) Date: Jan. 15, 2018

(87) PCT Pub. No.: WO2018/149121
PCT Pub. Date: Aug. 23, 2018

(65) Prior Publication Data
US 2019/0011783 A1    Jan. 10, 2019

(30) Foreign Application Priority Data
Feb. 16, 2017   (CN) .......................... 2017 1 0084273

(51) Int. Cl.
G02F 1/1337   (2006.01)
C09K 19/56    (2006.01)
(Continued)

(52) U.S. Cl.
CPC ........ *G02F 1/133723* (2013.01); *C09K 19/56* (2013.01); *G02F 1/1343* (2013.01); *H01L 23/50* (2013.01)

(58) Field of Classification Search
CPC ..... H01L 23/50; H01L 51/0096; C08K 3/042; G02F 1/13; G02F 1/133305;
(Continued)

(56) References Cited

U.S. PATENT DOCUMENTS

| 6,610,462 B1 | 8/2003 | Chien et al. |
| 2009/0225264 A1 | 9/2009 | Fu et al. |
| 2016/0004125 A1 | 1/2016 | Li et al. |

FOREIGN PATENT DOCUMENTS

| CN | 101526695 A | 9/2009 |
| CN | 102898833 A | 1/2013 |

(Continued)

OTHER PUBLICATIONS

International Search Report & Written Opinion dated Nov. 23, 2017, regarding PCT/CN2017/101536.

*Primary Examiner* — Thoi V Duong
(74) *Attorney, Agent, or Firm* — Intellectual Valley Law, P.C.

(57) ABSTRACT

A display baseplate and preparation method thereof, and a display device are provided, which belong to the field of display technology. The display baseplate includes a substrate and a conductive alignment film over the substrate. The conductive alignment film is of a composite material comprising graphene and polyimide.

18 Claims, 3 Drawing Sheets

(51) Int. Cl.
*H01L 23/50* (2006.01)
*G02F 1/1343* (2006.01)

(58) Field of Classification Search
CPC ............. G02F 1/1333; G02F 1/133723; G02F 1/1343; G02F 1/13439; G02F 1/1337; G02F 1/133711; G02F 1/1362; G02F 1/1533; G02F 2202/16; G02F 2202/022; G02F 2001/133796; C09K 19/56
See application file for complete search history.

(56) References Cited

FOREIGN PATENT DOCUMENTS

| | | | | |
|---|---|---|---|---|
| CN | 103676331 A | 3/2014 | | |
| CN | 104109327 A | 10/2014 | | |
| CN | 105527757 A | 4/2016 | | |
| JP | 58-145917 | * | 8/1983 | ........ G02F 1/133711 |

* cited by examiner

DISPLAY BASEPLATE AND PREPARATION METHOD THEREOF, AND DISPLAY DEVICE

CROSS-REFERENCE TO RELATED APPLICATION

This patent application is a national stage application under 35 U.S.C. § 371 of International Application No. PCT/CN2017/101536, filed Sep. 13, 2017, which claims the priority of the Chinese Patent Application No. 201710084273.2, entitled "DISPLAY BASEPLATE AND PREPARATION METHOD THEREOF, AND DISPLAY DEVICE" filed on Feb. 16, 2017, which is hereby incorporated by reference herein in its entirety.

TECHNICAL FIELD

The disclosure relates to the field of display technology, and in particular but not limited to, a display baseplate and preparation method thereof, and a display device.

BACKGROUND

A Thin Film Transistor-Liquid Crystal Display (TFT-LCD) is widely used because of its advantages like being thin and light, and energy-efficient. At present, the principle of the TFT-LCD is mainly photoluminescence, that is, the light of a backlight is adjusted by driving the rotation of the liquid crystal between a color film substrate and an array substrate, through a voltage applied between them, and color image display is realized through the color film substrate.

SUMMARY

The present disclosure provides a display baseplate, and method for preparing the display baseplate.

According to some aspects, a display baseplate is provided. The display baseplate may include a substrate and a conductive alignment film over the substrate, where the conductive alignment film is of a composite material comprising graphene and polyimide.

Optionally, a content of the polyimide by weight is greater than that of the graphene in the composite material.

Optionally, the composite material may further include polyacrylic acid.

Optionally, a content of the polyimide by weight is greater than that of the polyacrylic acid in the composite material.

Optionally, the content of the polyimide by weight in the composite material is greater than 50%.

Optionally the content of the polyimide by weight in the composite material ea e than 80%.

According to some aspects, a method for preparing a display baseplate is provided. The method may include forming a composite material comprising graphene and polyimide, and forming a conductive alignment film on a substrate of the display baseplate, where conductive alignment film is formed using the composite material.

Optionally, forming of the composite material may include providing graphene oxide, preparing a mixture of graphene oxide and polyacrylic acid, and causing a reduction of the mixture of the graphene oxide and polyacrylic acid, thereby producing the composite material including graphene and polyimide.

Optionally, preparing of the mixture of graphene oxide and polyacrylic acid may include: dissolving the graphene oxide and a polyacrylic acid each in a solvent to form a graphene oxide solution and a polyacrylic acid solution respectively, and mixing the graphene oxide solution and the polyacrylic acid solution.

Optionally, forming of the conductive alignment film may include dissolving the composite material in an organic solvent, coating a substrate with the dissolved composite material by a wet coating process to form a coated baseplate, and drying the coated baseplate.

Optionally, the method may also include washing the coated baseplate with deionized water to remove impurities.

Optionally, a content of the polyimide by weight is greater than that of the graphene in the composite material.

Optionally, a ratio of the graphene oxide to the solvent is 1:100 to 1:50, and a ratio of the polyacrylic acid to the solvent is 1:100 to 1:50.

Optionally, the solvent comprises water or N-methyl pyrrolidone.

Optionally, the ratio of the graphene oxide solution to the polyacrylic acid solution is 1:200 to 1:20.

Optionally, the composite material may further include the polyacrylic acid.

Optionally, a content of the polyimide by weight is greater than that of the polyacrylic acid in the composite material.

Optionally, the content of the polyimide by weight in the composite material is greater than 50%.

Optionally, the content of the polyimide by weight in the composite material is greater than 80%.

According to some aspects, a display device is provided that may include the display baseplate disclosed herein.

It should be understood that both the foregoing general description and the following detailed description are only exemplary and explanatory and are not restrictive of the disclosure.

DETAILED DESCRIPTION OF EMBODIMENTS

For enabling those skilled in the art to understand the technical solution of the disclosure better, the disclosure is further elaborated below in combination with the accompanying drawings and the specific embodiments.

In this disclosure, the term "baseplate" refers to a substrate with various functional layers or electrical circuits formed thereon, and in some instances it may also be used interchangeably with "substrate". A display panel typically includes an may substrate and a color film substrate forming a cell together with liquid crystal in-between.

Figure 1:
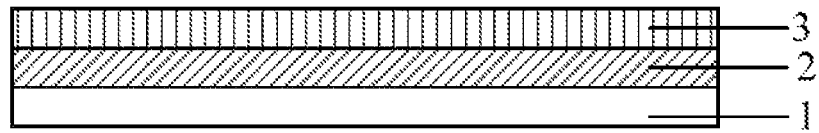
FIG. 1 is a schematic diagram of a display baseplate.

As shown in FIG. 1, in the display panel, a metal oxide film 2 (e.g. an Indium Tin Oxide (ITO) film) is set on a substrate 1 to drive the rotation of the liquid crystal between the color film substrate and the array substrate. At the same time, in order to align a liquid crystal layer in the display panel, a liquid crystal alignment layer 3 is set above the substrate. That is, two processes for preparing the display baseplate are performed, namely: i) preparing the metal oxide film 2 and ii) preparing the liquid crystal alignment layer 3.

Figure 2:
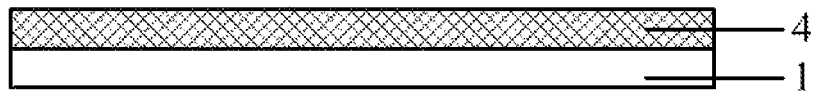
FIG. 2 is a schematic diagram of a display baseplate according to some embodiments of the disclosure.

Referring to FIG. 2, it provides a display baseplate. The display baseplate includes a substrate 1 and a conductive alignment film 4 over the substrate 1. The conductive alignment film 4 is of a composite material comprising graphene and polyimide.

It is noted that, in practical applications, the conductive alignment film 4 may not necessarily be on the substrate 1 directly, and there may be other layers or structures between them. FIG. 2 is a schematic diagram, which may not represent an actual product structure. The display baseplate in some embodiments can be an array baseplate or a color film baseplate.

Graphene is a planar material made up of carbon atoms presenting hexagonal honeycomb lattices through $sp^2$ hybridization. The thickness of graphene may be 0.336 nm. It is the thinnest but hardest nanometer material in the world. Graphene has high light transmittance and heat conductive coefficient, and has high electron mobility at room temperature. Moreover, the electrical resistivity of graphene is very low, so sphere may be the material with the lowest electrical resistivity. Since graphene has the characteristics of very low electrical resistivity and high electron migration velocity, it has excellent electrical properties such as high electrical conductivity.

In the display baseplate of some embodiments, the material of the conductive alignment film 4 is formed by graphene and polyimide. Since graphene has excellent electrical conductivity and polyimide has excellent alignment performance, the composite containing these two can realize both an electrical conducting function and an aligning function, that is, one conductive alignment film 4 in some embodiments can replace the two-layer structure of metal oxide film and liquid crystal alignment layer in other implementations. When the display baseplate is prepared, it may suffice to perform a single process of preparing the conductive alignment film 4 on the substrate, thereby simplifying the technical process of producing the display baseplate, reducing production cost and increasing production capacity. At the same time, since the conducting function and the aligning function can be realized by preparing one conductive alignment film 4, the thickness of the display baseplate can be reduced, thereby achieving a lighter and thinner product.

The composite material has the two contents, namely graphene and polyimide, well mixed at microscopic scale, and therefore does not have a clear interface between one content and another. Because graphene and polyimide are well mixed, the conductive alignment film 4 can be formed in a single layer structure. This can be completed by simply applying a mixture of them on a substrate, instead of stacking one layer over another.

In some embodiments, the content of polyimide by weight is greater than that of graphene in the composite material comprising graphene and polyimide.

In some other embodiments, the composite material may further comprise other contents or impurity substance, as long as these other contents does not materially affect the main function of the conductive alignment film 4, namely the electrical conducting function and liquid crystal alignment function. In some embodiments, the content of polyimide by weight in the composite material may be greater than 50%, or more preferably greater than 80%. The reason of this configuration is that the electrical conductivity of graphene is good. Therefore, the conductive alignment film 4 can realize good conducting function even if the content of graphene is low.

Moreover, since the content of polyimide by weight in the composite is high, the conventional process can be directly applied without need of being improved during subsequent rubbing alignment, thereby not increasing any processing difficulty.

In some yet further embodiments, the composite material may also include polyacrylic acid. In some embodiments, the composite material comprises graphene, polyimide, polyacrylic acid in a mass ratio of approximately 20:70:10.

Since the polyacrylic acid has certain electrical conductivity and adhesivity, it is beneficial for the bonding between graphene and polyimide. It is noted that, the polyacrylic acid in the composite may not be added separately, and in some embodiment, it is formed in the process of forming the composite. The polyimide is formed by reducing the polyacrylic acid. When the polyacrylic acid is reduced incompletely in the process of reduction, the composite will include the polyacrylic acid unreduced. The existence of certain amount of polyacrylic acid does not adversely influence the liquid crystal alignment of the composite.

In some other embodiments, the composite material may be prepared by directly mixing graphene and polyimide with a specified ratio, for example, 20:80. The specific ratio may be adjusted in the production process. The polyacrylie acid may also be added into the mixture, namely directly mixing graphene, polyimide and polyacrylie acid together. In this case, no reduction reaction is required, and the ratio of the contents may be more accurately controlled.

The content of polyimide by weight is greater than that of the polyacrylic acid in the composite. The aim of this configuration is to make the composite having better liquid crystal alignment property.

The display baseplate in some embodiments includes the substrate and the conductive alignment film over the substrate. The conductive aliment film is of a composite material comprising graphene and polyimide. Since graphene has excellent electrical conductivity and polyimide has good alignment performance, the composite containing them can realize both the conducting function and the aligning function, that is, one conductive alignment film 4 in some embodiments can replace the two-layer structure of metal oxide film and liquid crystal alignment layer in other implementations. When the display baseplate is prepared, it may suffice to perform a single process of preparing the conductive alignment film 4 on the substrate once, as compared to the processes of preparing two layers on the substrate, thereby simplifying the technical process of producing the display baseplate, reducing production cost and increasing production capacity. At the same time, since the conducting function and the aligning function can be realized by preparing one conductive alignment film 4, the thickness of the display baseplate can be reduced, thereby achieving a lighter and thinner product.

The method of preparing the display baseplate may comprise forming a composite material comprising graphene and polyimide; and forming a conductive alignment film on a substrate of the display baseplate, wherein conductive alignment film is formed using the composite material.

Figure 3:
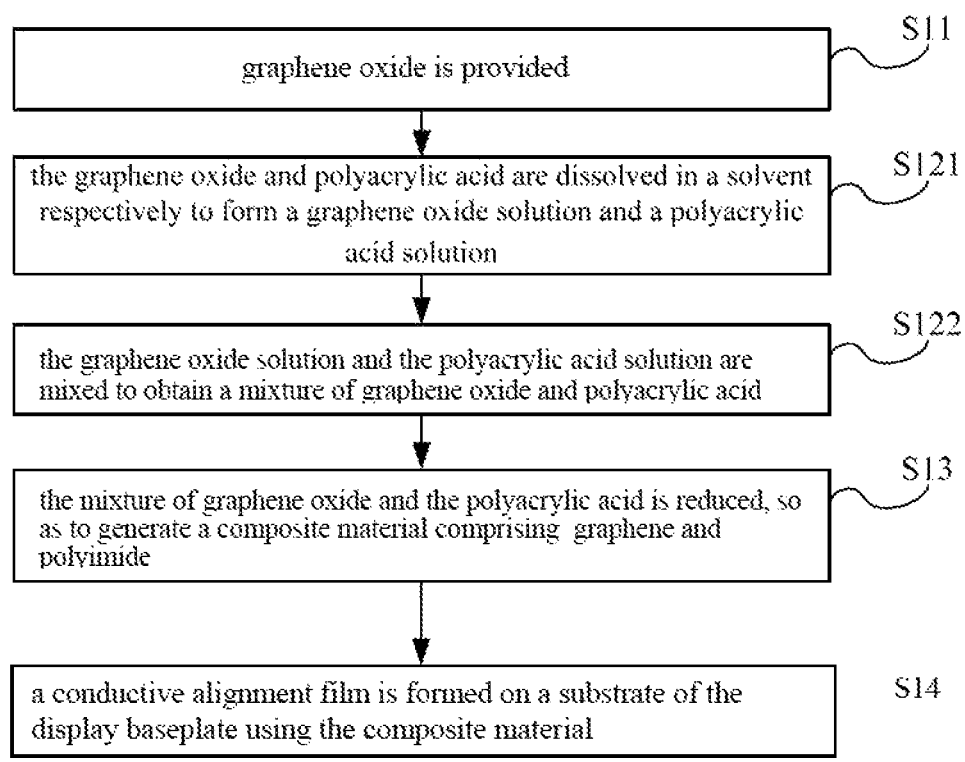
FIG. 3 is a flowchart of a method for preparing of the display baseplate according to some embodiments of the disclosure.

Referring to FIG. 3, it provides a method for preparing the display baseplate according to one embodiment, which includes the following steps.

Step S11: graphene oxide is provided.

Specifically, a proper amount of concentrated sulphuric acid, a certain amount of powdered graphite, $K_2S_2O_8$ (potassium persulfate), $P_2O_5$ (phosphorus pentoxide) and so on are mixed and stirred. After a certain time of reaction in water bath of 80° C., the mixture is diluted with water, centrifuged to separate the product, which is then dried in a vacuum oven. In ice bath, the dried product is mixed with the concentrated sulphuric acid and $KMnO_4$ (potassium permanganate), and then stirred. The mixture obtained thereby is diluted with water and stirred. After that, a proper amount of water and $H_2O_2$ (hydrogen peroxide) are added then centrifuging to obtain the centrifuged graphene oxide. The centrifuged graphene oxide is washed with hydrochloric acid and water, or dialyzed to remove foreign ions. At last, ultrasonic dispersion is performed to obtain the graphene oxide solution.

Methods of preparing the graphene oxide, including reaction time and reagent dosage are well known to a skilled person in the art, and therefore will not be elaborated in detail here. Alternatively, the graphene oxide available on the market can also be used directly.

Subsequently, a mixture of graphene oxide and polyacrylic acid is prepared, which is shown in FIG. 3 as two steps S121 and S122.

Step S121: the graphene oxide and the polyacrylic acid are each dissolved in a solvent to form a graphene oxide solution and a polyacrylic acid solution respectively, wherein the solvent may be, or comprise substantially of, water or N-methyl pyrrolidone.

The ratio of the graphene oxide to the solvent by weight is 1:100 to 1:50, and the ratio of the polyacrylic acid to the solvent is 1:100 to 1:50. Other examples are in the scope of this disclosure, and the ratios can be set and fine-tuned according to the actual production condition.

In this embodiment, the solvent for dissolving the graphene oxide and the solvent for dissolving the polyacrylic acid are the same. That is, dissolving both the graphene oxide and the polyacrylic acid in water or in N-methyl pyrrolidone. Other examples of the solvent are in the scope of this disclosure, and other organic solvents can also be adopted.

Step S122: the graphene oxide solution and the polyacrylic acid solution are mixed to obtain the mixture of graphene oxide and polyacrylic acid.

The ratio of the graphene oxide solution to the polyacrylic acid solution is 1:200 to 1:20. The ratio of the graphene oxide solution to the polyacrylic acid solution can be set according to the actual production condition. After they are mixed, the mixing of the graphene oxide and polyacrylic acid can be accelerated in ultrasonic or stirring manner.

Step S13: the mixture of graphene oxide and polyacrylic acid is reduced, so as to generate the composite material comprising graphene and polyimide.

The graphene oxide in the mixture of graphene oxide and polyacrylic acid prepared in the step S122 may be reduced to graphene by the method of chemical reduction or thermal reduction. At the same time, the polyacrylic acid in the mixture of graphene oxide and polyacrylic acid is transformed into the polyimide.

In some embodiments, the composite material comprising graphene and polyimide may also include polyacrylic acid.

It is noted that, in this embodiment, the polyacrylic acid in the composite is not added separately, and it is formed in the process of forming the composite. The polyimide is formed by reducing the polyacrylic acid. When the polyacrylic acid is reduced incompletely in the process of reduction, the composite will include the polyacrylic acid unreduced. The existence of certain amount of polyacrylic acid would not adversely influence the liquid crystal alignment property of the composite.

In some embodiments, the content of the polyimide by weight is greater than that of the polyacrylic acid in the composite material comprising graphene and polyimide. This configuration makes the composite have better liquid crystal alignment property.

Step S14: the conductive alignment film is formed on the substrate of the display baseplate. The material of the conductive alignment film includes the composite at least containing graphene and polyimide.

After the step S13 is completed, the obtained composite at least containing graphene and polyimide, in this embodiment, the graphene-polyimide composite or the graphene-polyacrylic acid-polyimide composite, is dissolved in an organic solvent, e.g. γ-hydracrylic acid lactone. Then, the organic solution dissolved with the composite is coated on the substrate by a wet coating process. At last, the coated material is dried and forms film to obtain the display baseplate provided with the conductive alignment film.

The wet coating process may include spin coating, spray coating, blade coating, ink-jet printing, screen printing and so on. Other examples of the wet coating process blown to a person skilled in the art are in the scope of this disclosure.

It is noted that, the baseplate with the film formed on it is first washed with deionized water to remove impurities, and then dried in a vacuum oven to volatilize the solvent, thereby preventing pollution.

Since graphene has excellent electrical conductivity and polyimide has good alignment performance the composite containing them can realize both the conducting function and the aligning function, that is, one conductive alignment film in some embodiments can replace the two-layer structure of metal oxide film and liquid crystal alignment layer in other implementations. When the display baseplate is prepared, it may suffice to perform a process of preparing the conductive alignment film on the substrate once, thereby simplifying the technical process of producing the display baseplate, reducing production cost and increasing production capacity. At the same time, since the conducting function and the aligning function can be realized by preparing one conductive alignment film, the thickness of the display baseplate can be reduced, thereby achieving a lighter and thinner product.

Some embodiments provide a display device, which includes the display baseplate in some other embodiments. The display device can be a liquid crystal display panel, electronic paper, a mobile phone, a tablet personal computer, a television, a displayer or monitor, a notebook computer, a digital phone frame, a navigator and any product or component with a display function.

For the display device in some embodiments, since graphene has excellent electrical conductivity and polyimide has good alignment performance, the composite containing them can realize both the conducting function and the aligning function, that is, one conductive alignment film in some embodiments can replace the two-layer structure of metal oxide film and liquid crystal alignment layer in other implementations. When the display baseplate is prepared, it may suffice to perform a process of preparing the conductive alignment film on the substrate once, thereby simplifying the technical process of the display baseplate, reducing production cost and increasing production capacity. At the same time, since the conducting function and the aligning function can be realized by preparing one conductive alignment film, the thickness of the display baseplate can be reduced, thereby achieving a lighter and thinner product.

It can be understood that the above embodiments are only used for exemplarily purpose illustrating the principle of the disclosure, but not intended to limit the disclosure or the scope of protection as claimed. Those skilled in the art can make various modifications and improvements, without departing from the spirit and essence of the disclosure. These modifications and improvements should be construed within the protection scope of the disclosure.

The invention claimed is:

1. A display baseplate, comprising:
   a substrate and
   a conductive alignment film over the substrate,
   wherein the conductive alignment film is of a composite material comprising graphene, polyacrylic acid, and polyimide.

2. The display baseplate according to claim 1, wherein a content of the polyimide by weight is greater than that of the graphene in the composite material.

3. The display baseplate according to claim 2, wherein the content of the polyimide by weight in the composite material is greater than 50%.

4. The display baseplate according to claim 2, wherein the content of the polyimide by weight in the composite material is greater than 80%.

5. The display baseplate according to claim 1, wherein a content of the polyimide by weight is greater than that of the polyacrylic acid in the composite material.

6. A display device, comprising the display baseplate according to claim 1.

7. A method for preparing a display baseplate, comprising:
   forming a composite material comprising graphene and polyimide; and
   forming a conductive alignment film on a substrate of the display baseplate, wherein conductive alignment film is formed using the composite material,
   wherein forming of the composite material comprises:
   providing graphene oxide;
   preparing a mixture of graphene oxide and polyacrylic acid; and
   causing a reduction of the mixture of the graphene oxide and polyacrylic acid, thereby producing the composite material comprising graphene and polyimide.

8. The method according to claim 7, wherein preparing of the mixture of graphene oxide and polyacrylic acid comprises:
   dissolving the graphene oxide and a polyacrylic acid each in a solvent to form a graphene oxide solution and a polyacrylic acid solution respectively; and
   mixing the graphene oxide solution and the polyacrylic acid solution.

9. The method according to claim 8, wherein a ratio of the graphene oxide to the solvent is 1:100 to 1:50, and a ratio of the polyacrylic acid to the solvent is 1:100 to 1:50.

10. The method according to claim 9, wherein the ratio of the graphene oxide solution to the polyacrylic acid solution is 1:200 to 1:20.

11. The method according to claim 8, wherein the solvent comprises water or N-methyl pyrrolidone.

12. The method according to claim 7, wherein forming of the conductive alignment film comprises:
    dissolving the composite material in an organic solvent;
    coating a substrate with the dissolved composite material by a wet coating process to form a coated baseplate; and
    drying the coated baseplate.

13. The method according to claim 12, further comprising washing the coated baseplate with deionized water to remove impurities.

14. The method according to claim 7, wherein a content of the polyimide by weight is greater than that of the graphene in the composite material.

15. The method according to claim 7, wherein the composite material further comprises the polyacrylic acid.

16. The method according to claim 15, wherein a content of the polyimide by weight is greater than that of the polyacrylic acid in the composite material.

17. The method according to claim 16, wherein the content of the polyimide by weight in the composite material is greater than 50%.

18. The method according to claim 17, wherein the content of the polyimide by weight in the composite material is greater than 80%.

* * * * *